United States Patent
Yeom et al.

(10) Patent No.: US 11,127,570 B2
(45) Date of Patent: Sep. 21, 2021

(54) PLASMA SOURCE AND PLASMA GENERATION APPARATUS USING THE SAME

(71) Applicant: Research & Business Foundation Sungkyunkwan University, Suwon-si (KR)

(72) Inventors: Geun Young Yeom, Seoul (KR); Ki Hyun Kim, Daejeon (KR); Ki Seok Kim, Incheon (KR); You Jin Ji, Gunpo-si (KR); Jin Woo Park, Goyang-si (KR); Doo San Kim, Suncheon-si (KR); Won Oh Lee, Hwaseong-si (KR); Chang Hoon Song, Sangju-si (KR); Ji Young Byun, Suwon-si (KR); Ji Soo Oh, Suwon-si (KR); Hyun Woo Tak, Yongin-si (KR)

(73) Assignee: Research and Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 16/220,792

(22) Filed: Dec. 14, 2018

(65) Prior Publication Data
US 2019/0221404 A1   Jul. 18, 2019

(30) Foreign Application Priority Data
Oct. 16, 2017   (KR) .......................... 10-2017-0134023

(51) Int. Cl.
*H01J 37/32* (2006.01)

(52) U.S. Cl.
CPC .. *H01J 37/32577* (2013.01); *H01J 37/32091* (2013.01); *H01J 37/32541* (2013.01); *H01J 37/32568* (2013.01); *H01J 37/32715* (2013.01); *H01J 2237/327* (2013.01)

(58) Field of Classification Search
USPC ..................................................... 156/345.46
See application file for complete search history.

(56) References Cited

U.S. PATENT DOCUMENTS

| | | | |
|---|---|---|---|
| 5,683,548 A * | 11/1997 | Hartig | .................. C23C 16/507 |
| | | | 438/729 |
| 8,018,163 B2 * | 9/2011 | Wi | ..................... H01J 37/32091 |
| | | | 156/345.44 |

FOREIGN PATENT DOCUMENTS

| | | | | |
|---|---|---|---|---|
| JP | 2011-138712 | * | 7/2011 | ............... H05H 1/46 |
| JP | 2013-134815 A | | 7/2013 | |
| KR | 2002-0085320 A | | 11/2002 | |
| KR | 10-2010-0026530 A | | 3/2010 | |

* cited by examiner

*Primary Examiner* — Ram N Kackar
(74) *Attorney, Agent, or Firm* — NSIP Law

(57) ABSTRACT

A plasma source device includes a pair of divided electrodes including a first divided electrode and a second divided electrode spaced apart from each other and electrically coupled to each other; and a ferrite structure comprising a portion interposed the first divided electrode and the second divided electrode.

10 Claims, 9 Drawing Sheets

Top

: electrode

: ferrite

Side

PLASMA SOURCE AND PLASMA GENERATION APPARATUS USING THE SAME

CROSS-REFERENCE TO RELATED APPLICATIONS

This application claims the benefit under 35 USC 119(a) of Korean Patent Application No. 10-2017-0134023 filed on Oct. 16, 2017, in the Korean Intellectual Property Office.

BACKGROUND

1. Field

The present disclosure relates to a plasma source and a plasma generation apparatus using the same. More particularly, the present disclosure relates to a plasma source capable of achieving a high plasma density and uniformity and a plasma generation apparatus using the same.

2. Description of Related Art

Generally, a plasma generation apparatus for generating plasma in a vacuum atmosphere may include a capacitively coupled plasma (CCP) generation apparatus in which a target substrate is positioned between an upper plate electrode and a lower plate electrode to generate plasma therebetween via a capacitor behavior, and an inductively coupled plasma (ICP) generation apparatus for generating a plasma by generating a field in a reaction chamber using an upper coil and a lower electrode of a flat plate type opposing the coil.

Such a plasma generation apparatus generally includes two large parallel electrodes disposed in a vacuum chamber. The vacuum chamber is filled with a reaction gas mixed at a precise flow rate and hydraulic pressure. The target substrate is placed on the lower electrode of the two electrodes. A high power RF signal is applied between the two electrodes, whereby the reaction gas is converted to a high energy plasma, which is a charged aggregate of ionized atoms and molecules. Deposition and etching of thin films using the plasma are widely used in semiconductor manufacturing processes.

Recently, a VHF plasma generation apparatus using very-high-frequency (VHF) power has been used. Using the VHF power, a gas dissociation rate is high such that an ion bombardment energy is small and high density plasma formation is achieved at a low electron temperature and stable plasma formation is achieved even at a low pressure.

However, as these plasma generation apparatuses are large-sized to handle a large-area target substrate, a length of the plasma source device must be long. As a result, there is a problem that loss of applied power and non-uniformity of plasma are increased.

Furthermore, when a power to be applied is supplied using a 13.56 MHz power supply, a standing wave effect is caused in a plasma source device corresponding to a half wavelength length, making it impossible to treatment a larger target substrate. The standing wave effect may refer to a phenomenon in which when two waves with the same amplitude and frequency move in opposite directions and overlap each other, this looks like as if the waves stops.

SUMMARY

A purpose of the present disclosure is to provide a plasma source device and a plasma generation apparatus using the same in which a strong magnetic field is concentrated toward a target substrate, and high plasma density and uniformity are achieved.

Another purpose of the present disclosure is to provide a plasma source device and a plasma generation apparatus using the same in which, even at an edge of the plasma source device, plasma is uniformly generated without loss of a power.

Still another purpose of the present disclosure is to provide a plasma source device and a plasma generation apparatus using the same in which a damage to an electrode during plasma generation may be prevented.

In a first aspect of the present disclosure, a plasma source device includes a pair of divided electrodes including a first divided electrode and a second divided electrode spaced apart from each other and electrically coupled to each other; and a ferrite structure comprising a portion interposed between the first divided electrode and the second divided electrode.

In one embodiment of the first aspect, the plasma source device further includes additional pairs of divided electrodes, wherein each pair of the additional pairs of divided electrodes comprises a first divided electrode and a second divided electrode spaced apart from each other and electrically coupled to each other, and the additional pairs of divided electrodes and the pair of divided electrodes constitute a plurality of pairs of divided electrodes; additional ferrite structures, wherein each of the additional ferrite structures comprises a portion interposed between the first divided electrode and the second divided electrode of a respective pair of the additional pairs of divided electrodes, and the additional ferrite structures and the ferrite structure constitute a plurality of ferrite structures; and further ferrite structures, wherein the plurality of ferrite structures and the plurality of pairs of divided electrodes are linearly arranged in a first direction, the plurality of pairs of divided electrodes are spaced apart from each other, and each of the further ferrite structures comprises a portion interposed between a respective two adjacent pairs of the plurality of pairs of divided electrodes.

In one embodiment of the first aspect, the plasma source device further includes additional pairs of divided electrodes, wherein each pair of the additional pairs of divided electrodes comprises a first divided electrode and a second divided electrode spaced apart from each other and electrically coupled to each other, and the additional pairs of divided electrodes and the pair of divided electrodes constitute a plurality of pairs of divided electrodes; additional ferrite structures, wherein each of the additional ferrite structures comprises a portion interposed between the first divided electrode and the second divided electrode of a respective pair of the additional pairs of divided electrodes, and the additional ferrite structures and the ferrite structure constitute a plurality of ferrite structures; and further ferrite structures, wherein the plurality of ferrite structures and the plurality of pairs of divided electrodes are linearly arranged in a first direction and a second direction perpendicular to the first direction to form a matrix, the plurality of pairs of divided electrodes are spaced apart from each other, and each of the further ferrite structures comprises a portion interposed between a respective two adjacent pairs of the plurality of pairs of divided electrodes.

In one embodiment of the first aspect, the plasma source device further includes a dielectric plate, and the pair of divided electrodes and the ferrite structure are linearly arranged on the dielectric plate.

In one embodiment of the first aspect, the plasma source device further includes a dielectric plate, and the pair of divided electrodes and the ferrite structure are linearly arranged and embedded in the dielectric plate.

In one embodiment of the first aspect, the ferrite structure includes a plate-shaped base disposed on the first divided electrode and the second divided electrode; and a protrusion protruding from one face of the base perpendicular to the one face and interposed between the first divided electrode and the second divided electrode.

In one embodiment of the first aspect, each of the first divided electrode and the second divided electrode includes a rectangular plate having two short sides and two long sides, and the first divided electrode and the second divided electrode are disposed so that one long side of the rectangular plate of the first divided electrode is spaced apart from one long side of the rectangular plate of the second divided electrode so that the first divided electrode and the second divided electrode are electrically coupled to each other via the long sides of the rectangular plates that are spaced apart from each other.

In a second aspect of the present disclosure, a plasma generation apparatus includes a vacuum chamber; a pedestal disposed in the vacuum chamber and configured to support a target substrate at a predetermined position on the pedestal; a plasma source device disposed in the vacuum chamber and including a pair of divided electrodes including a first divided electrode and a second divided electrode spaced apart from each other and electrically coupled to each other; and a ferrite structure comprising a portion interposed between the first divided electrode and the second divided electrode, wherein the plasma source device is configured to generate a magnetic field in one direction via the ferrite structure in response to power being applied to either the first divided electrode or the second divided electrode; and a power supply configured to supply the power to either the first divided electrode or the second divided electrode to cause the plasma source device to generate the magnetic field, wherein the plasma source device is spaced apart from the predetermined position at which the target substrate is to be supported by the pedestal, and is oriented so that the magnetic field generated by the plasma source device is directed toward the predetermined position at which the target substrate is to be supported by the pedestal.

In one embodiment of the second aspect, the plasma source device further includes additional pairs of divided electrodes, wherein each pair of the additional pairs of divided electrodes comprises a first divided electrode and a second divided electrode spaced apart from each other and electrically coupled to each other, and the additional pairs of divided electrodes and the pair of divided electrodes constitute a plurality of pairs of divided electrodes; additional ferrite structures, wherein each of the additional ferrite structures comprises a portion interposed between the first divided electrode and the second divided electrode of a respective pair of the additional pairs of divided electrodes, and the additional ferrite structures and the ferrite structure constitute a plurality of ferrite structures; and further ferrite structures, wherein the plurality of ferrite structures and the plurality of pairs of divided electrodes are linearly arranged in a first direction, the plurality of pairs of divided electrodes are spaced apart from each other, and each of the further ferrite structures comprises a portion interposed between a respective two adjacent pairs of the plurality of pairs of divided electrodes.

In one embodiment of the second aspect, the plasma source device further includes additional pairs of divided electrodes, wherein each pair of the additional pairs of divided electrodes comprises a first divided electrode and a second divided electrode spaced apart from each other and electrically coupled to each other, and the additional pairs of divided electrodes and the pair of divided electrodes constitute a plurality of pairs of divided electrodes; additional ferrite structures, wherein each of the additional ferrite structures comprises a portion interposed between the first divided electrode and the second divided electrode of a respective pair of the additional pairs of divided electrodes, and the additional ferrite structures and the ferrite structure constitute a plurality of ferrite structures; and further ferrite structures, wherein the plurality of ferrite structures and the plurality of pairs of divided electrodes are linearly arranged in a first direction and a second direction perpendicular to the first direction to form a matrix, the plurality of pairs of divided electrodes are spaced apart from each other, and each of the further ferrite structures comprises a portion interposed between a respective two adjacent pairs of the plurality of pairs of divided electrodes.

In one embodiment of the second aspect, the plasma source device further includes a dielectric plate, and the pair of divided electrodes and the ferrite structure are linearly arranged on the dielectric plate.

In one embodiment of the second aspect, the plasma source device further includes a dielectric plate, and the pair of divided electrodes and the ferrite structure are linearly arranged and embedded in the dielectric plate.

In one embodiment of the second aspect, the ferrite structure includes a plate-shaped base disposed on the first divided electrode and the second divided electrode; and a protrusion protruding from one face of the base perpendicular to the one face and interposed between the first divided electrode and the second divided electrode.

In one embodiment of the second aspect, each of the first divided electrode and the second divided electrode includes a rectangular plate having two short sides and two long sides, and the first divided electrode and the second divided electrode are disposed so that one long side of the rectangular plate of the first divided electrode is spaced apart from one long side of the rectangular plate of the second divided electrode so that the first divided electrode and the second divided electrode are electrically coupled to each other via the long sides of the rectangular plates that are spaced apart from each other.

According to the present disclosure, a strong magnetic field is concentrated toward a target substrate, and high plasma density and uniformity are achieved. Further, even at an edge of the plasma source device, plasma is uniformly generated without loss of a power. Moreover, a damage to an electrode during plasma generation may be prevented.

BRIEF DESCRIPTION OF DRAWINGS

FIG. 8 shows a reduction rate of plasma non-uniformity based on the size of each electrode and the spacing between the electrodes.

DETAILED DESCRIPTION

Hereinafter, plasma sources and plasma generation apparatuses using the plasma sources are described with reference to accompanying drawings in detail. Since the present disclosure may have diverse modified embodiments, specific embodiments are illustrated in the drawings and are described in the detailed description. However, this does not limit the present disclosure to these specific embodiments, and it should be understood that the present disclosure covers all the modifications, equivalents, and replacements within the idea and technical scope of the present disclosure. In the drawings, like reference numerals denote like elements, and dimensions of structures may be enlarged or exaggerated for clarity.

It will be understood that although the terms of first and second are used herein to describe various elements, these elements should not be limited by these terms. Terms are only used to distinguish one component from other components. Therefore, a component referred to as a first component in one embodiment can be referred to as a second component in another embodiment.

In the following description, the technical terms are used only for explaining a specific embodiment while not limiting the present disclosure. The terms of a singular form may include plural forms unless referred to the contrary. The meaning of 'include' or 'comprise' specifies a property, a numeral, a step, an operation, an element or a combination thereof, but does not exclude other properties, numerals, steps, operations, elements or combinations thereof.

Unless terms used in the present application are defined differently, the terms may be construed as meaning known to those skilled in the art. Terms such as terms that are generally used and have been in dictionaries should be construed as having meanings matched with contextual meanings in the art. In this description, unless defined clearly, terms are not ideally, excessively construed as formal meanings.

Figure 1:
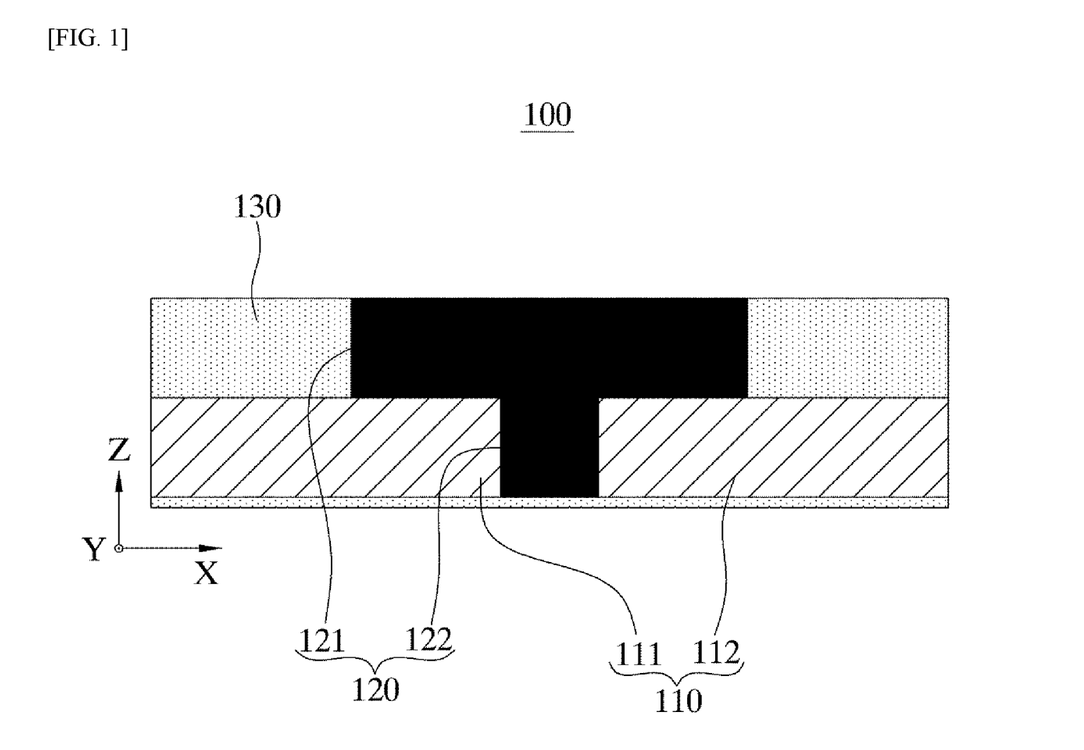
FIG. 1 is a cross-sectional view of a plasma source device according to an embodiment of the present disclosure.

FIG. 1 is a cross-sectional view of a plasma source device according to an embodiment of the present disclosure.

Referring to FIG. 1, a plasma source device 100 according to an embodiment of the present disclosure may include a pair of divided electrodes 110 and a ferrite structure 120.

The pair of divided electrodes 110 include a first divided electrode 111 and a second divided electrode 112. Each of the first divided electrode 111 and the second divided electrode 112 is provided in a plate form. The first divided electrode 111 and the second divided electrode 112 are spaced apart from each other by a certain distance and are electrically coupled to each other. In this connection, the electrical coupling means mutual power coupling. When the first divided electrode 111 and the second divided electrode 112 are connected to a power supply to generate a magnetic field, one of the first divided electrode 111 and the second divided electrode 112 acts as a power electrode, while the other thereof acts as a ground electrode.

In one example, each of the first divided electrode 111 and the second divided electrode 112 has a square plate shape. In another example, each of the first divided electrode 111 and the second divided electrode 112 has a rectangular plate shape. In this connection, long sides of the rectangular first divided electrode 111 and second divided electrode 112 may be electrically coupled to each other. Thus, the power is rapidly coupled between the first divided electrode 111 and the second divided electrode 112.

In one example, although not shown, each divided electrode has holes defined therein to form a showerhead to allow a process gas to flow in and out to supply the process gas into a vacuum atmosphere containing the process gas.

The ferrite structure 120 is partially inserted between the first divided electrode 111 and the second divided electrode 112 to concentrate a magnetic field formed around the first divided electrode 111 and the second divided electrode 112 in one direction. For this purpose, the ferrite structure 120 may have a structure capable of concentrating the magnetic field in one direction.

In one example, the ferrite structure 120 may include a base 121 and a protrusion 122. The base 121 may have a plate shape. The protrusion 122 may protrude from one face of the base 121 and extend perpendicular to a longitudinal direction of the base 121. In this case, the protrusion 122 of the ferrite structure 120 may be inserted between the first divided electrode 111 and the second divided electrode 112. In this connection, the base 121 is disposed on one face of each of the first divided electrode 111 and the second divided electrode 112 and partially covers the one face. This structure of the ferrite structure 120 may allow a magnetic field generated around the first divided electrode 111 and the second divided electrode 112 to be directed outwardly from a surface of each of the first divided electrode 111 and the second divided electrode 112 that is not in contact with the base 121. For example, the magnetic field may be formed radially toward an opposite side to the base 121.

The ferrite structure 120 may be made of a ferromagnetic material having a high magnetic permeability. The ferromagnetic material may be strongly magnetized in an external magnetic field in the same direction as a magnetization direction of the external magnetic field. Therefore, the plasma source device 100 according to the present disclosure having the ferrite structure 120 may generate a relatively strong magnetic field as compared with a conventional plasma source device, thereby realizing a high plasma density.

Figure 2:
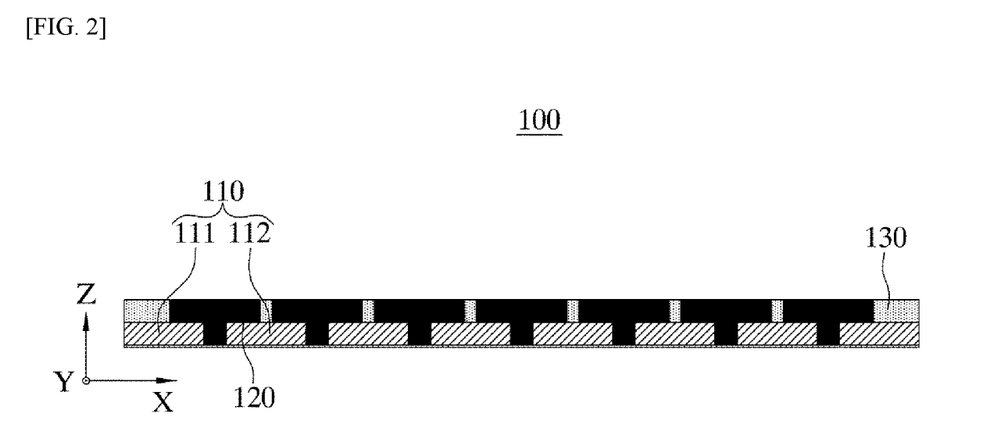
FIG. 2 is a cross-sectional view showing a configuration in which pairs of divided electrodes and ferrite structures as shown in FIG. 1 are linearly arranged along a first direction.
Figure 3A:
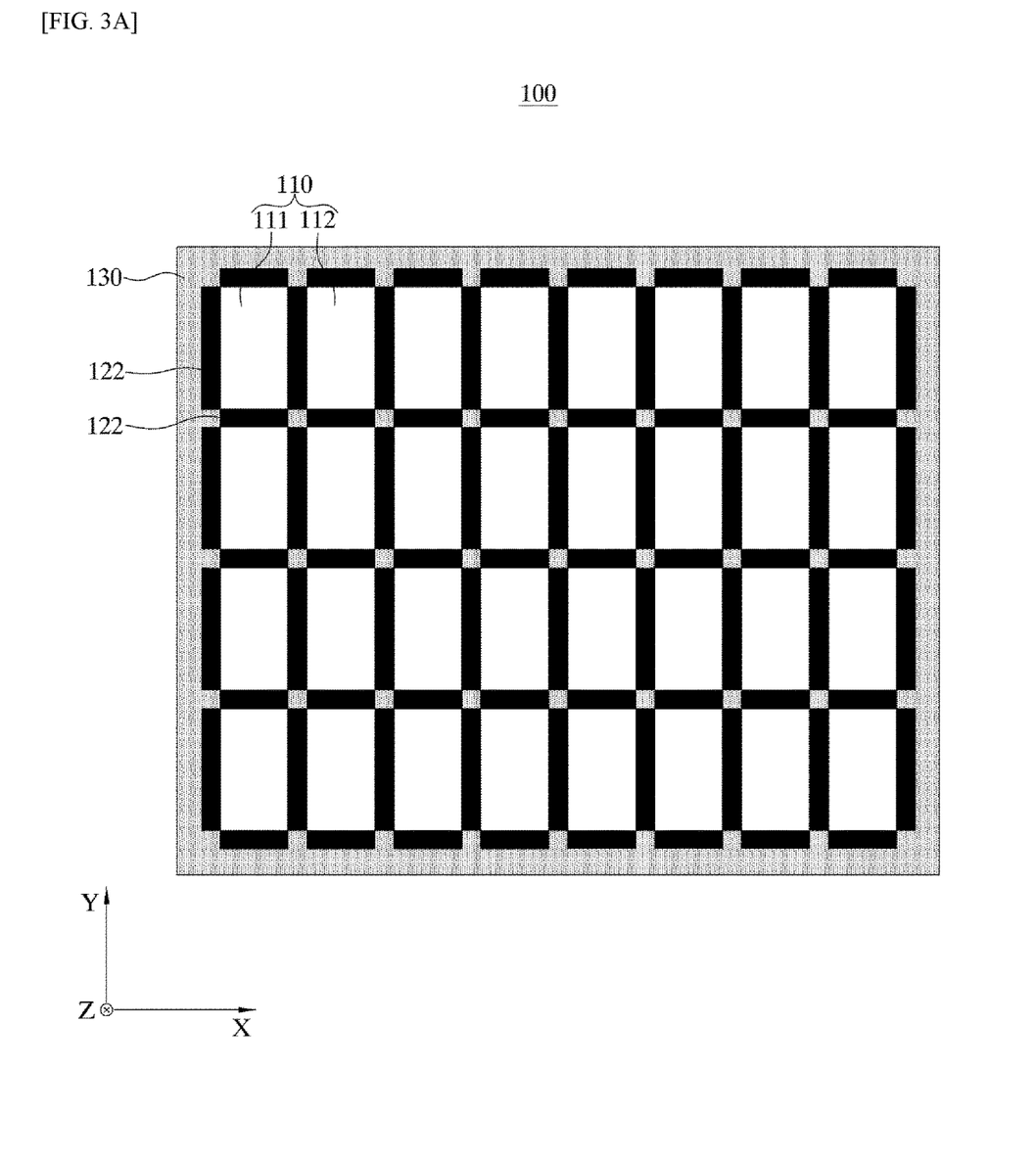
FIG. 3A shows a network structure formed by linearly arranging the pairs of divided electrodes and ferrite structures shown in FIG. 1 in the first direction and a second direction.
Figure 3B:
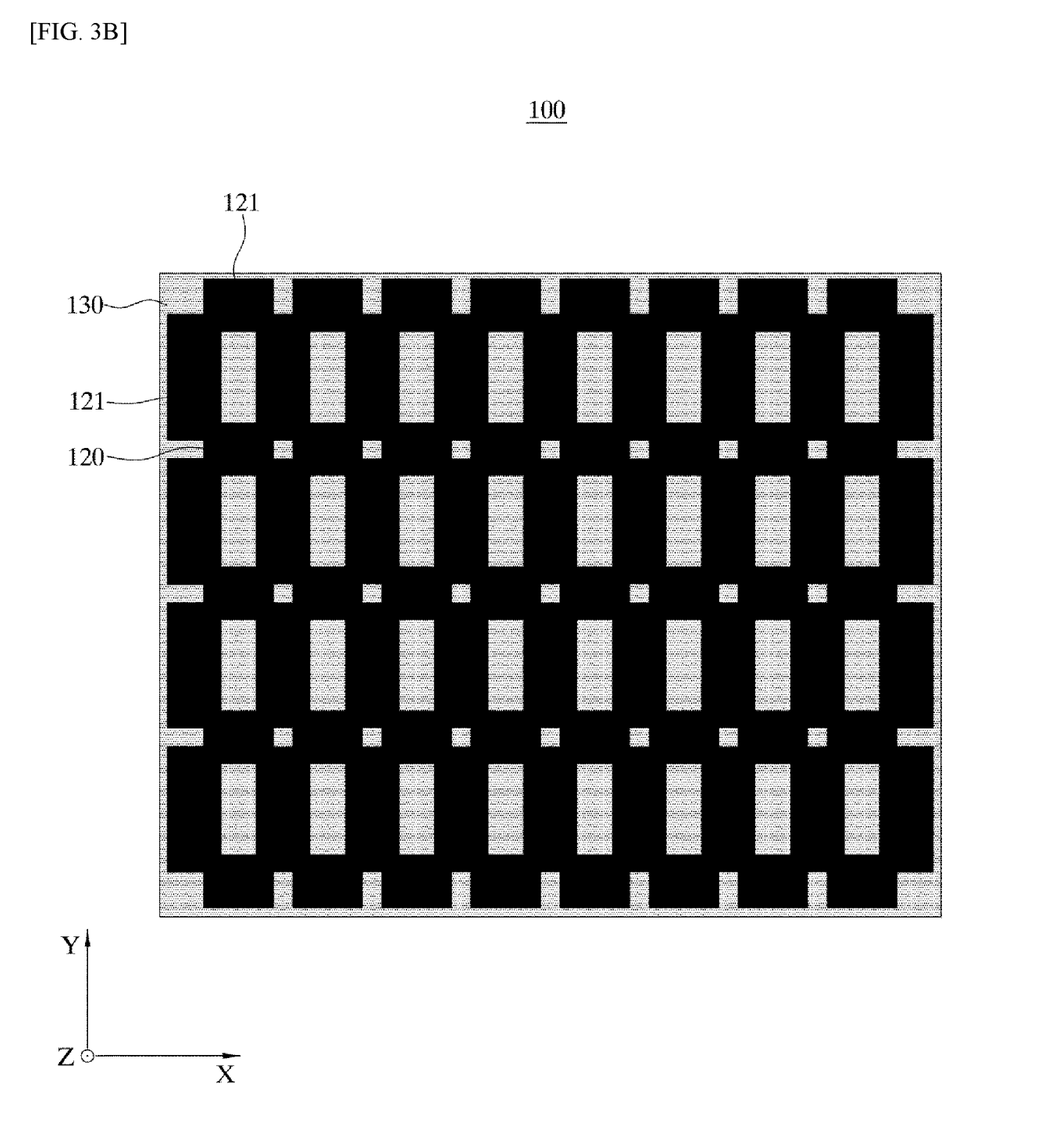
FIG. 3B shows a topside view of the base shown FIG. 1.

FIG. 2 is a cross-sectional view showing a configuration in which pairs of divided electrodes and ferrite structures as shown in FIG. 1 are linearly arranged along a first direction. FIG. 3A shows a network structure formed by linearly arranging the pairs of divided electrodes and ferrite structures shown in FIG. 1 in the first direction and a second direction.

In one example, a plurality of pairs of divided electrodes 110 and a plurality of ferrite structures 120 may be arranged to form a plasma source device.

In one example, the pairs of divided electrodes 110 and ferrite structures 120 may be arranged linearly along the first direction X, as shown in FIG. 2. That is, the pairs of divided electrodes 110 and ferrite structures 120 may be arranged in a row. In this connection, the long side of each of the rectangular shaped first divided electrode 111 and the rectangular shaped second divided electrode 112 of each pair of the divided electrodes 110 extends perpendicular to the first direction X. The long sides of the divided electrodes 111 and 112 are spaced apart from each other and are arranged parallel to each other. The long sides of the divided electrodes 111 and 112 spaced apart from each other and arranged parallel to each other may be electrically coupled to each other. Thus, the power is rapidly coupled between the first divided electrode 111 and the second divided electrode 112.

In another example, a plurality of pairs of divided electrodes 110 and a plurality of ferrite structures 120 are arranged along a first direction X, a second direction Y perpendicular to the first direction X, and a third direction Z, as shown in FIG. 3A, to form a matrix structure. In this connection, adjacent pairs of divided electrodes 110 may be arranged to be spaced apart by a certain spacing. The spacing between adjacent pairs of divided electrodes 110 may be the same as the spacing between the first divided electrode 111 and the second divided electrode 112.

In these examples, the ferrite structure 120 may be additionally interposed between adjacent pairs of divided electrodes 110. Accordingly, the magnetic field generated between the adjacent pairs of divided electrodes 110 may be concentrated in one direction by the ferrite structure 120.

In one example, a plasma source device according to one embodiment of the present disclosure may further include a dielectric plate 130.

The dielectric plate 130 may cover and protect the pairs of divided electrodes 110 and the ferrite structures 120. For this purpose, the pairs of divided electrodes 110 and ferrite structures 120 may be arranged linearly on or in the dielectric plate 130. In one example, the pair of divided electrodes 110 and ferrite structure 120 may be disposed on the dielectric plate 130. In another example, the pair of divided electrodes 110 and the ferrite structure 120 may be embedded within the dielectric plate 130.

Figure 4:
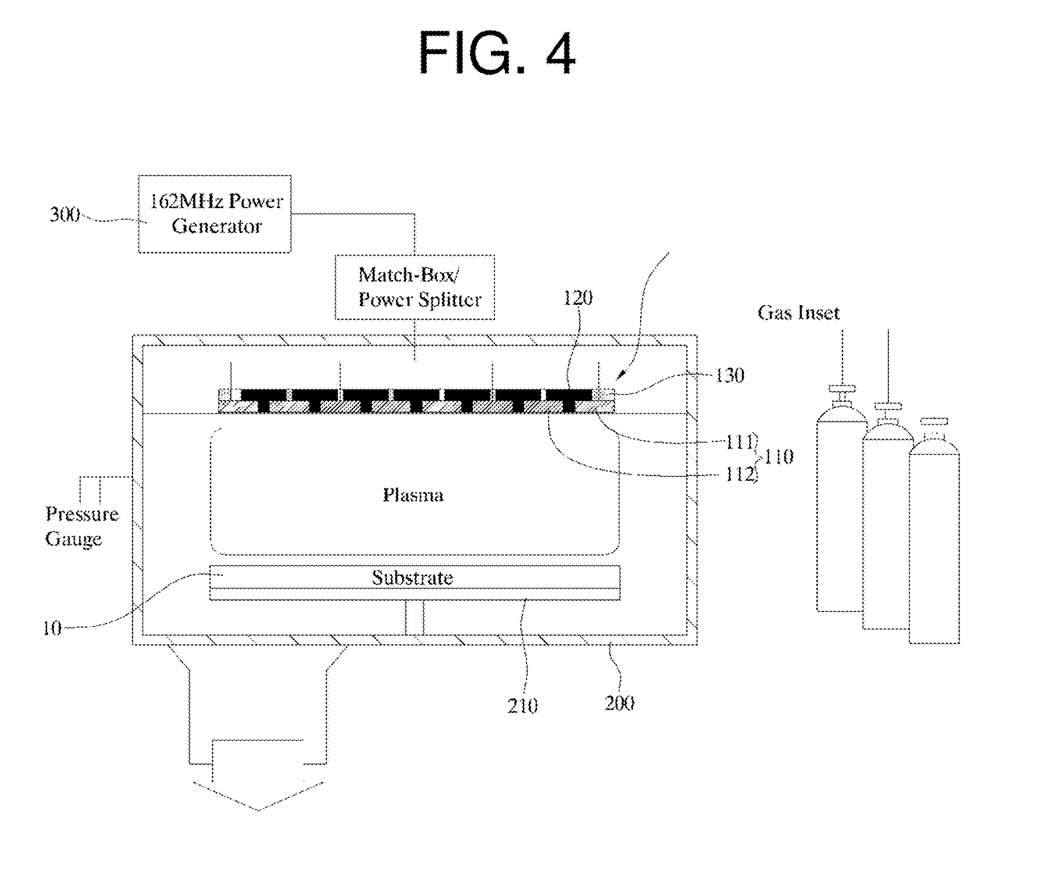
FIG. 4 shows an embodiment of a plasma generation apparatus using a plasma source device according to an embodiment of the present disclosure.

The plasma source device according to one embodiment of the present disclosure may be used in a plasma generation apparatus. FIG. 4 shows an embodiment of a plasma generation apparatus using the plasma source device according to an embodiment of the present disclosure.

Referring to FIG. 4, a plasma generation apparatus according to an embodiment of the present disclosure may include a vacuum chamber 200, a plasma source device 100, and a power supply 300.

A pedestal 210 for supporting the target substrate thereon may be disposed within the inner space of the vacuum chamber 200. An exhaust line connected to a vacuum pump (not shown) communicates with the inner space of the vacuum chamber 200 at a portion of a bottom or side wall of the vacuum chamber 200, such that the inner space of the vacuum chamber 200 may be brought into a vacuum atmosphere.

The plasma source device 100 includes the pair of divided electrodes 110, the ferrite structure 120, and the dielectric plate 130. In one embodiment, in the plasma source device 100, a matrix array of the pairs of divided electrodes 110 and the ferrite structures 120 may be embedded in the dielectric plate 130 as in the plasma source device shown in FIG. 3A. The pairs of divided electrodes 110 are electrically coupled to each other.

The plasma source device 100 may be spaced by a certain distance from the target substrate placed on the pedestal 210 inside the vacuum chamber 200. In this connection, a magnetic field may be generated as the power is applied to the plasma source device 100 and then may be concentrated in one direction by the ferrite structure 120. Thus, the field may be directed to the target substrate 10 placed on the pedestal 210. That is, the protrusion direction of the protrusion 122 of the ferrite structure 120 in the plasma source device 100 is directed to the target substrate 10. In this connection, the dielectric plate 130 faces away the target substrate 10. The magnetic field may be concentrated toward the dielectric plate 130.

The power supply 300 applies the power to the plasma source device 100. To this end, the power supply 300 may be connected to either the first divided electrode 111 or the second divided electrode 112 of each of the plurality of the pairs of divided electrodes 110 of the plasma source device 100. The power supply 300 may provide very-high-frequency (VHF) power (e.g., in the range of 30 to 162 MHz). Alternatively, the power supply 300 may apply RF power.

The plasma generation apparatus according to one embodiment of the present disclosure may be used in a semiconductor process. For example, the apparatus may be used as a thin film deposition equipment.

When the apparatus is used for thin film deposition, the target substrate 10 is placed on the pedestal 210 in the vacuum chamber 200, and, the power is applied to the plasma source device 100 via the power supply 300 while the vacuum is maintained in the chamber. In this connection, the plasma source device 100 may have a structure in which the pairs of divided electrodes 110 and ferrite structures 120 are embedded in the dielectric plate 130 and are arranged to form a network structure. In this case, the power supply 300 applies the power to one of the linearly arranged pairs of divided electrodes 110. The applied power may be supplied to the pair of divided electrodes 110 by electrically coupling the pair of divided electrodes 110.

When power is applied to the plasma source device 100, the magnetic field is generated between the first divided electrode 111 and the second divided electrode 112 of each pair of divided electrodes 110. In this connection, the magnetic field generated around the first divided electrode 111 and the second divided electrode 112 is concentrated in one direction by the ferrite structure 120 disposed between the first divided electrode 111 and the second divided electrode 112. That is, the magnetic field is concentrated toward the target substrate 10 from one face each of the first divided electrode 111 and the second divided electrode 112 where the ferrite structure 120 does not contact.

Simultaneously or previously, a reaction gas is injected into the vicinity of the plasma source device 100. The injected reaction gas dissociates in response to reaction with the magnetic field to generate plasma. Thus, the reactant may be deposited on the surface of the target substrate 10 by plasma. For example, the thin film to be deposited may be a thin film of silicon dioxide $SiO_2$, silicon nitride $Si_3N_4$, or the like.

Using the plasma source device according to one embodiment of the present disclosure and the plasma generation apparatus using the plasma source device, the ferrite structure 120 is provided between the linearly arranged divided electrodes 111 and 112. Thus, due to the large magnetic permeability of the ferrite, the apparatus may generate a relatively strong magnetic field compared to the conventional plasma source device, thereby to achieve the high plasma density and uniformity. Further, the plasma source device 100 reduces the power loss resulting from the generation of the magnetic field in the opposite direction to the target substrate. As a result, the efficiency of the etching or deposition process applied to the target substrate may increase to improve a yield in the semiconductor device fabrication.

Further, the pairs of the divided electrodes 110 are linearly continuous. The electrodes 111 and 112 to generate the magnetic field are linearly arranged in a divided manner and each of the electrodes 111 and 112 has the shape of a rectangular plate, and the long sides of the rectangles are electrically coupled to each other. Thus, the power is rapidly coupled between the first divided electrode 111 and the second divided electrode 112. Thus, when power is applied to the plasma source device 100, the magnetic field for plasma generation is formed at a position of each of the linearly arranged pairs of divided electrodes 110 and, thus, the magnetic field is linearly continuous along a direction in which the pairs of divided electrodes 110 are arranged. In this way, there is an advantage that the plasma may be uniformly generated at the edge of the plasma source device 100 without loss of power. Thus, the problem of power loss and plasma non-uniformity at the edge of the electrode due to the standing wave effect generated in the conventional capacitively coupled plasma (CCP) generation apparatus may be solved. That is, in the conventional capacitively coupled plasma (CCP) generation apparatus, a VHF or RF power supplied from the power supply 300 is applied thereto. When the size of the electrode is large, the electric field intensity from the electrode may cause the standing wave effect. However, according to the present disclosure, the pairs of divided electrodes 110 are linearly and continuously arranged. This may solve the problem of the power loss and plasma non-uniformity due to the standing wave effect.

Further, since the pair of divided electrodes 110 is protected by the dielectric plate 130, there is an advantage that the electrodes may be prevented from being damaged during the plasma generation.

Figure 5:
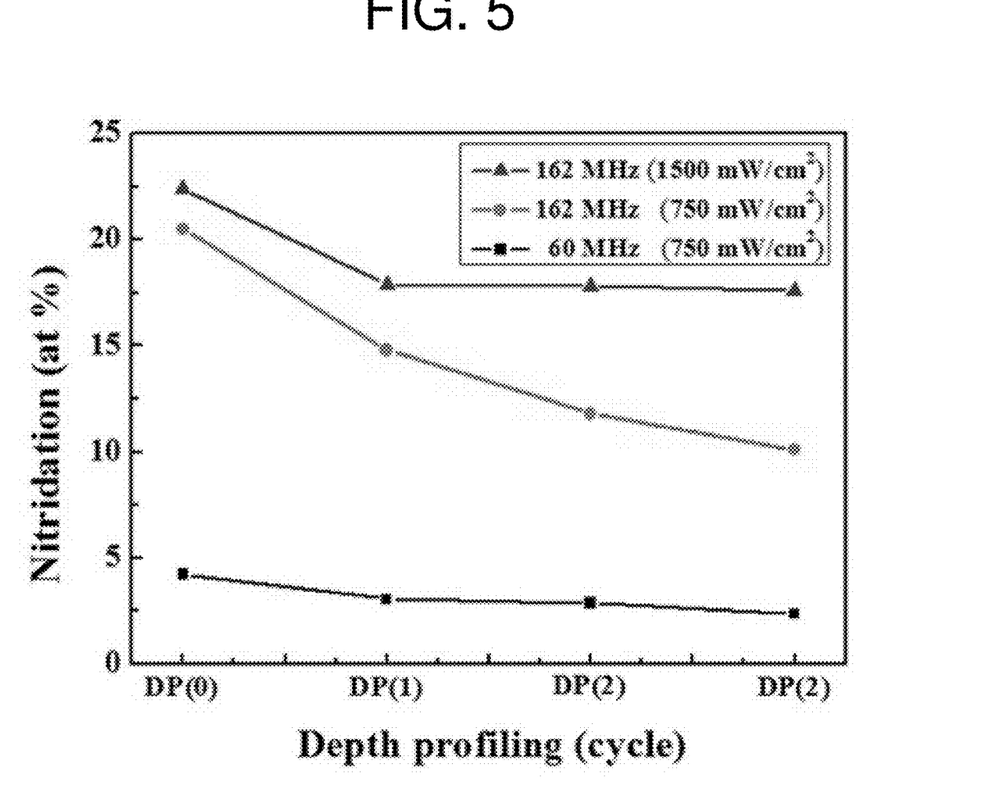
FIG. 5 is a graph showing a result of comparing nitridation rates for first and second thin films via X-ray Photoelectron Spectroscopy analysis, wherein the first thin film is deposited by the plasma generation apparatus according to an embodiment of the present disclosure supplying a power of 162 MHz to a plasma source device, whereas, the second thin film is deposited by a conventional CCP plasma generation apparatus supplying a power of 60 MHz to a plasma source device.

FIG. 5 is a graph showing a result of comparing nitridation rates for first and second thin films via X-ray Photoelectron Spectroscopy analysis, wherein the first thin film is deposited by the plasma generation apparatus according to an embodiment of the present disclosure supplying a power of 162 MHz to a plasma source device, whereas, the second thin film is deposited by a conventional CCP plasma generation apparatus supplying a power of 60 MHz to a plasma source device.

Referring to FIG. 5, it was confirmed that the nitridation rate for a silicon nitride thin film deposited by the plasma generation apparatus according to an embodiment of the present disclosure is higher compared to the nitridation rate for a silicon nitride film deposited by the conventional capacitively coupled plasma (CCP) generation apparatus supplying a power of 60 MHz.

Figure 6:
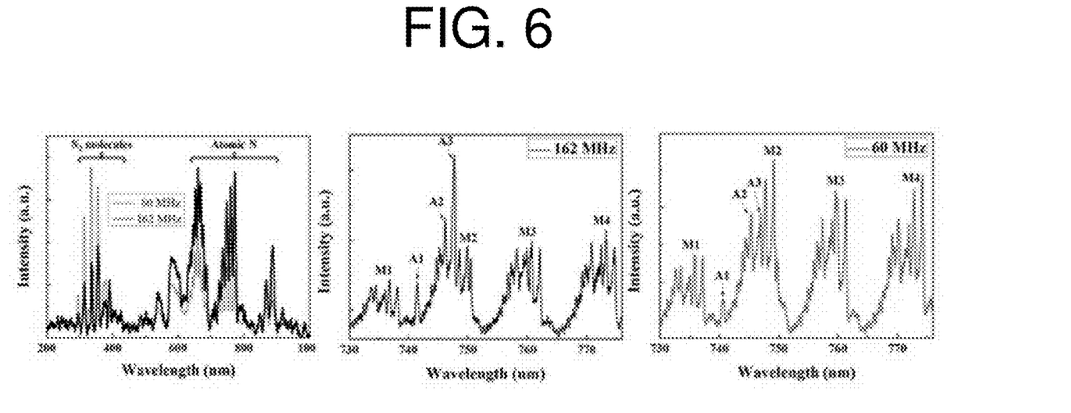
FIG. 6 shows a graph showing a result of comparing first and second dissociation rates of nitrogen ($N_2$) via OES (optical emission spectroscopy) analysis, wherein the first dissociation rate is achieved by the plasma generation apparatus according to an embodiment of the present disclosure supplying a power of 162 MHz to a plasma source device, whereas, the second dissociation rate is achieved by a conventional CCP plasma generation apparatus supplying a power of 60 MHz to a plasma source device.

FIG. 6 shows a graph showing a result of comparing first and second dissociation rates of nitrogen ($N_2$) via OES (optical emission spectroscopy) analysis, wherein the first dissociation rate is achieved by the plasma generation apparatus according to an embodiment of the present disclosure supplying a power of 162 MHz to a plasma source device, whereas, the second dissociation rate is achieved by a conventional CCP plasma generation apparatus supplying a power of 60 MHz to a plasma source device.

Referring to FIG. 6, it was confirmed that the dissociation rate of nitrogen achieved when the frequency of the 162 MHz region is supplied to the plasma source device according to an embodiment of the present disclosure is higher compared to the dissociation rate of nitrogen achieved by the conventional capacitively coupled plasma (CCP) generation apparatus supplying a power of 60 MHz region.

Figure 7A:
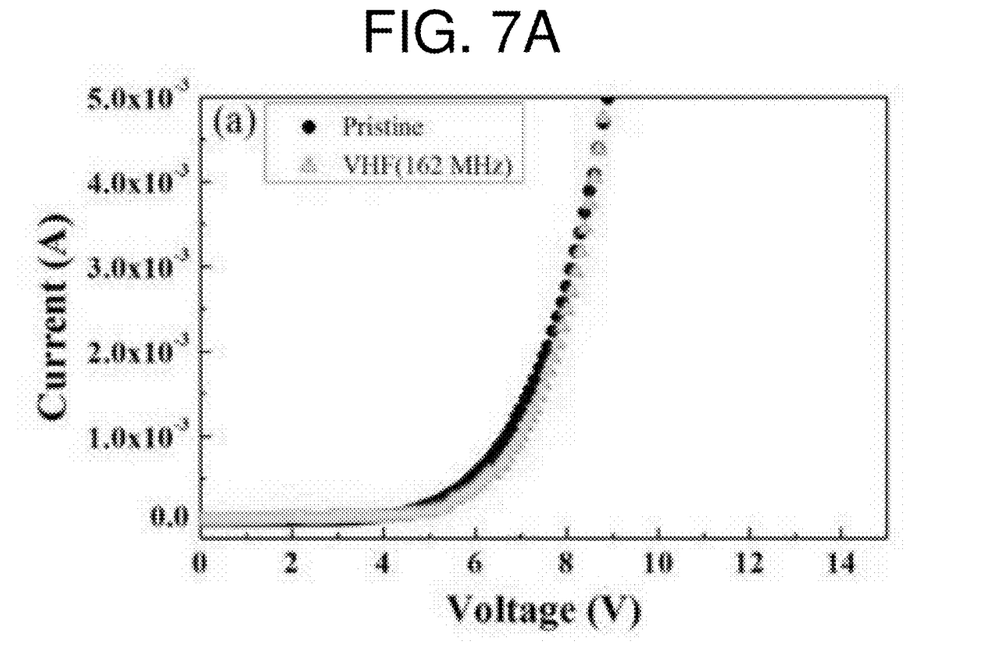
FIG. 7A is a graph of a plasma deposition-related damage as observed when evaluating an OLED (Organic Light Emitting Diode) element having an insulating film deposited by supplying a power of 162 MHz to a plasma source device in a plasma generation apparatus according to an embodiment of the present disclosure.
Figure 7B:
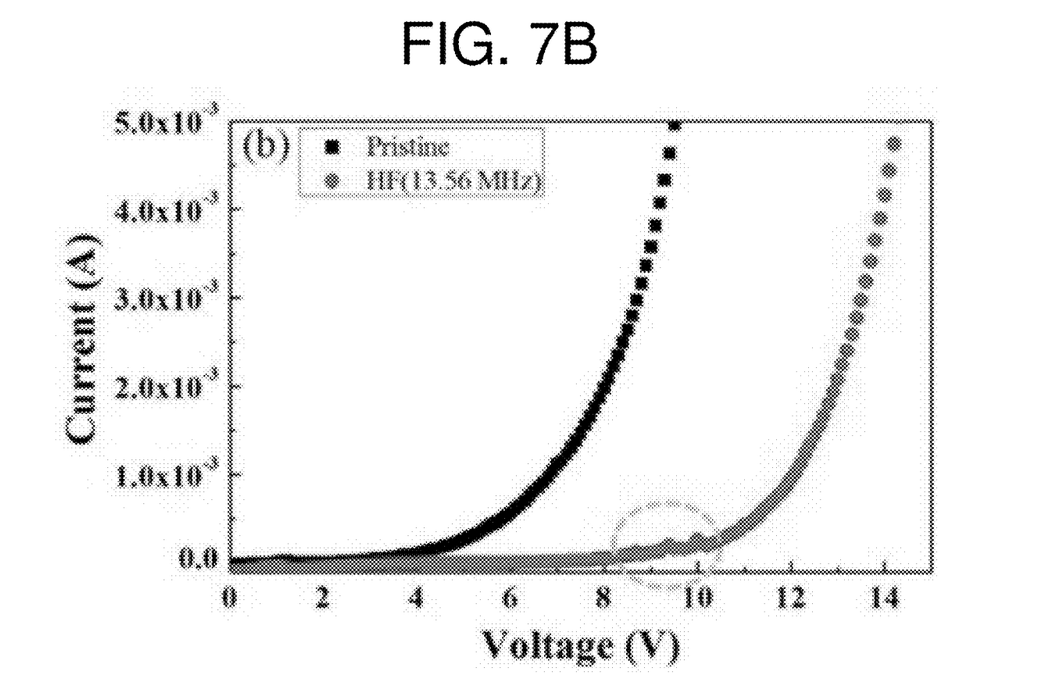
FIG. 7B is a graph of a plasma deposition-related damage as observed when evaluating an OLED (Organic Light Emitting Diode) element having an insulating film deposited by supplying a power of 13.56 MHz to a plasma source device in a conventional CCP plasma generation apparatus.

FIG. 7A is a graph of a plasma deposition-related damage as observed when evaluating an OLED (Organic Light Emitting Diode) element having an insulating film deposited by supplying a power of 162 MHz to a plasma source device in a plasma generation apparatus according to an embodiment of the present disclosure. FIG. 7B is a graph of a plasma deposition-related damage as observed when evaluating an OLED (Organic Light Emitting Diode) element having an insulating film deposited by supplying a power of 13.56 MHz to a plasma source device in a conventional CCP plasma generation apparatus.

As in the graph of FIG. 7A, in case of the OLED element having the insulating film deposited by the plasma generation apparatus according to an embodiment of the present disclosure, there was no deterioration in the quality of the OLED element before and after the deposition. However, as shown in the graph of FIG. 7B, it was observed that in case of the OLED element having the insulation film deposited by the conventional CCP generation apparatus supplying the frequency of 13.56 MHz, the emission intensity decrease (turn on voltage increase) and disturb (dotted circle portion) in a V curve occurred.

Therefore, using the plasma source device according to an embodiment of the present disclosure and the plasma generation apparatus using the plasma source device, there is an advantage that the efficiency in the semiconductor manufacturing process may be increased.

Figure 8:
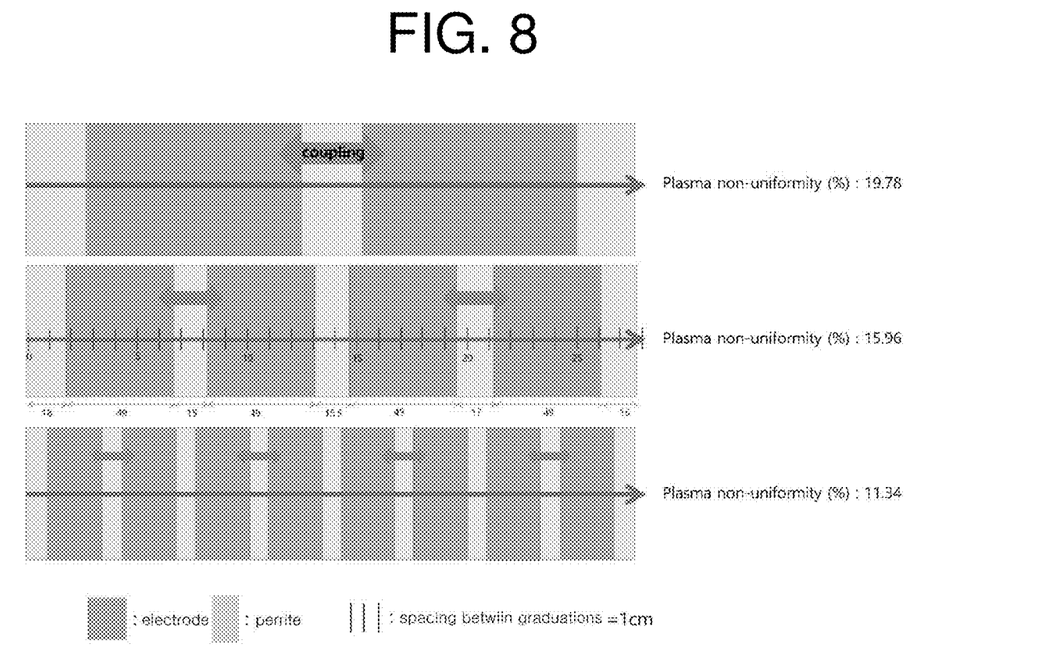
FIG. 8 illustrates a size of an electrode and a spacing between electrodes in the plasma source device and the plasma generation apparatus using the plasma source device according to an embodiment of the present disclosure.

FIG. 8 illustrates a size of an electrode and a spacing between electrodes in the plasma source device and the plasma generation apparatus using the plasma source device according to an embodiment of the present disclosure. FIG. 8 shows a reduction rate of plasma non-uniformity based on the size of each electrode and the spacing between the electrodes.

In one example, in the plasma source device according to an embodiment of the present disclosure and the plasma generation apparatus using the plasma source device, as shown in FIG. 8, as the size of the electrode of the plasma source device decreases, and as the spacing between the electrodes is smaller, the plasma uniformity is improved. Further, decreasing the size of the electrode as the frequency increases may allow the plasma non-uniformity due to the standing wave effect to be minimized.

Figure 9:
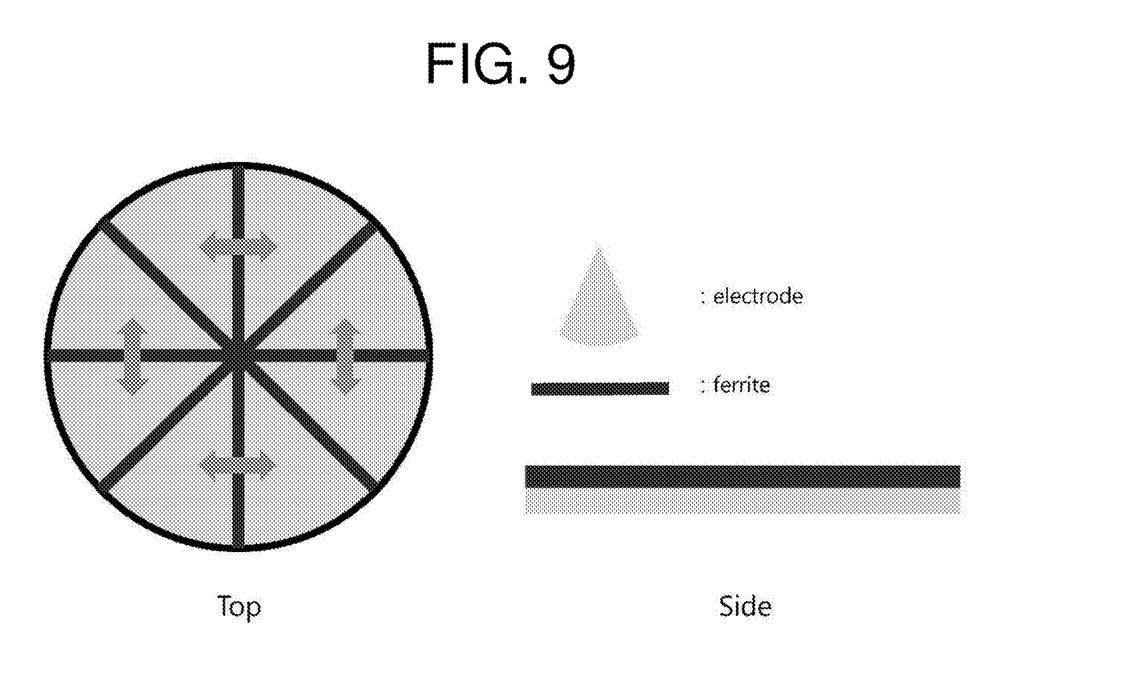
FIGS. 9 and 10 show a plasma source device according to an embodiment of the present disclosure and a plasma source device according to another embodiment of the present disclosure.
Figure 10:
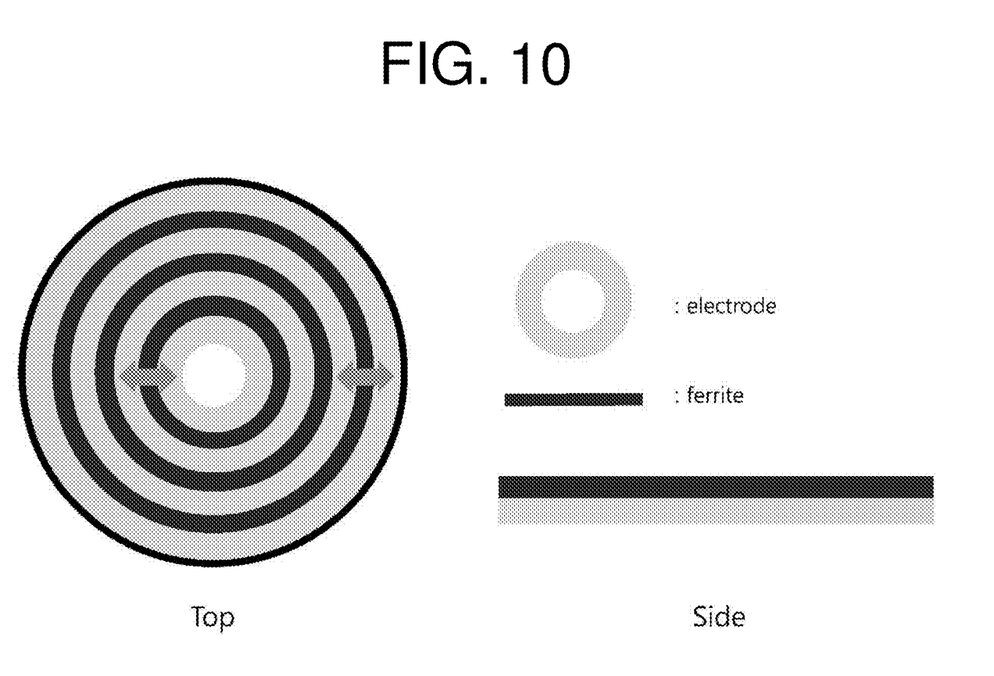

FIGS. 9 and 10 show a plasma source device according to an embodiment of the present disclosure and a plasma source device according to another embodiment of the present disclosure.

As shown in FIGS. 9 and 10, in one embodiment, the plasma source device has a top view of a circular shape and has an electrically-coupled divided circular-sector-shaped electrodes pair structure showing a symmetry. In another embodiment, the plasma source device has a top view of a circular shape and has an electrically-coupled ring-shaped electrodes pair structure. These configurations may also achieve plasma with high uniformity by minimizing the standing wave effect.

The descriptions of the presented embodiments are provided so that one of ordinary skill in the art of the present disclosure may use or implement the present disclosure. Various modifications to these embodiments will be readily apparent after an understanding of the present disclosure. The generic principles defined herein may be applied to other embodiments without departing from the scope of the present disclosure. Thus, the present disclosure is not to be limited to the embodiments set forth herein but is to be accorded the widest scope consistent with the principles and novel features presented herein.

The invention claimed is:

1. A plasma source device comprising:
   a pair of divided electrodes comprising a first divided electrode and a second divided electrode spaced apart from each other and electrically coupled to each other;
   a ferrite structure comprising a plate-shaped base disposed on the first divided electrode and the second divided electrode and a protrusion protruding from one face of the base, the protrusion being interposed between the first divided electrode and the second divided electrode; and
   a dielectric plate,
   wherein the pair of divided electrodes and the ferrite structure are embedded in the dielectric plate, and
   wherein at least a portion of the plate-shaped base overlaps with the pair of divided electrodes.

2. The plasma source device of claim 1, further comprising:
   additional pairs of divided electrodes, wherein each pair of the additional pairs of divided electrodes comprises a first divided electrode and a second divided electrode spaced apart from each other and electrically coupled to each other, and the additional pairs of divided electrodes and the pair of divided electrodes constitute a plurality of pairs of divided electrodes;
   additional ferrite structures, wherein each of the additional ferrite structures comprises a portion interposed between the first divided electrode and the second divided electrode of a respective pair of the additional pairs of divided electrodes, and the additional ferrite structures and the ferrite structure constitute a plurality of ferrite structures; and
   further ferrite structures,
   wherein the plurality of ferrite structures and the plurality of pairs of divided electrodes are linearly arranged in a first direction,
   the plurality of pairs of divided electrodes are spaced apart from each other, and
   each of the further ferrite structures comprises a portion interposed between a respective two adjacent pairs of the plurality of pairs of divided electrodes.

3. The plasma source device of claim 1, further comprising:
   additional pairs of divided electrodes, wherein each pair of the additional pairs of divided electrodes comprises a first divided electrode and a second divided electrode spaced apart from each other and electrically coupled to each other, and the additional pairs of divided electrodes and the pair of divided electrodes constitute a plurality of pairs of divided electrodes;
   additional ferrite structures, wherein each of the additional ferrite structures comprises a portion interposed between the first divided electrode and the second divided electrode of a respective pair of the additional pairs of divided electrodes, and the additional ferrite structures and the ferrite structure constitute a plurality of ferrite structures; and
   further ferrite structures,
   wherein the plurality of ferrite structures and the plurality of pairs of divided electrodes are linearly arranged in a first direction and a second direction perpendicular to the first direction to form a matrix,
   the plurality of pairs of divided electrodes are spaced apart from each other, and
   each of the further ferrite structures comprises a portion interposed between a respective two adjacent pairs of the plurality of pairs of divided electrodes.

4. The plasma source device of claim 1,
   wherein the pair of divided electrodes and the ferrite structure are linearly arranged on the dielectric plate.

5. The plasma source device of claim 1, wherein each of the first divided electrode and the second divided electrode comprises a rectangular plate having two short sides and two long sides, and
   the first divided electrode and the second divided electrode are disposed so that one long side of the rectangular plate of the first divided electrode is spaced apart from one long side of the rectangular plate of the second divided electrode so that the first divided electrode and the second divided electrode are electrically coupled to each other via the long sides of the rectangular plates that are spaced apart from each other.

6. A plasma generation apparatus comprising:
   a vacuum chamber;
   a pedestal disposed in the vacuum chamber and configured to support a target substrate at a predetermined position on the pedestal;
   a plasma source device disposed in the vacuum chamber and comprising:
      a pair of divided electrodes comprising a first divided electrode and a second divided electrode spaced apart from each other and electrically coupled to each other;
      a ferrite structure comprising a plate-shaped base disposed on the first divided electrode and the second divided electrode and a protrusion protruding from one face of the base, the protrusion being interposed between the first divided electrode and the second divided electrode; and
      a dielectric plate,
      wherein the pair of divided electrodes and the ferrite structure are embedded in the dielectric plate, and
      wherein at least a portion of the plate-shaped base overlaps with the pair of divided electrodes,
      wherein the plasma source device is configured to generate a magnetic field in one direction via the ferrite structure in response to power being applied to either the first divided electrode or the second divided electrode; and a power supply configured to supply the power to either the first divided electrode or the second divided electrode to cause the plasma source device to generate the magnetic field, wherein the plasma source device is spaced apart from the predetermined position at which the target substrate is to be supported by the pedestal, and is oriented so that the magnetic field generated by the plasma source device is directed toward the predetermined position at which the target substrate is to be supported by the pedestal.

7. The plasma generation apparatus of claim 6, wherein the plasma source device further comprises:

additional pairs of divided electrodes, wherein each pair of the additional pairs of divided electrodes comprises a first divided electrode and a second divided electrode spaced apart from each other and electrically coupled to each other, and the additional pairs of divided electrodes and the pair of divided electrodes constitute a plurality of pairs of divided electrodes;

additional ferrite structures, wherein each of the additional ferrite structures comprises a portion interposed between the first divided electrode and the second divided electrode of a respective pair of the additional pairs of divided electrodes, and the additional ferrite structures and the ferrite structure constitute a plurality of ferrite structures; and further ferrite structures, wherein the plurality of ferrite structures and the plurality of pairs of divided electrodes are linearly arranged in a first direction, the plurality of pairs of divided electrodes are spaced apart from each other, and each of the further ferrite structures comprises a portion interposed between a respective two adjacent pairs of the plurality of pairs of divided electrodes.

8. The plasma generation apparatus of claim 6, wherein the plasma source device further comprises:

additional pairs of divided electrodes, wherein each pair of the additional pairs of divided electrodes comprises a first divided electrode and a second divided electrode spaced apart from each other and electrically coupled to each other, and the additional pairs of divided electrodes and the pair of divided electrodes constitute a plurality of pairs of divided electrodes;

additional ferrite structures, wherein each of the additional ferrite structures comprises a portion interposed between the first divided electrode and the second divided electrode of a respective pair of the additional pairs of divided electrodes, and the additional ferrite structures and the ferrite structure constitute a plurality of ferrite structures; and further ferrite structures, wherein the plurality of ferrite structures and the plurality of pairs of divided electrodes are linearly arranged in a first direction and a second direction perpendicular to the first direction to form a matrix, the plurality of pairs of divided electrodes are spaced apart from each other, and each of the further ferrite structures comprises a portion interposed between a respective two adjacent pairs of the plurality of pairs of divided electrodes.

9. The plasma generation apparatus of claim 6, wherein the pair of divided electrodes and the ferrite structure are linearly arranged on the dielectric plate.

10. The plasma generation apparatus of claim 6, wherein each of the first divided electrode and the second divided electrode comprises a rectangular plate having two short sides and two long sides, and the first divided electrode and the second divided electrode are disposed so that one long side of the rectangular plate of the first divided electrode is spaced apart from one long side of the rectangular plate of the second divided electrode so that the first divided electrode and the second divided electrode are electrically coupled to each other via the long sides of the rectangular plates that are spaced apart from each other.

* * * * *